US 6,670,267 B2

(12) United States Patent
Fortin

(10) Patent No.: US 6,670,267 B2
(45) Date of Patent: Dec. 30, 2003

(54) FORMATION OF TUNGSTEIN-BASED INTERCONNECT USING THIN PHYSICALLY VAPOR DEPOSITED TITANIUM NITRIDE LAYER

(75) Inventor: Vincent Fortin, Santa Clara, CA (US)

(73) Assignee: Mosel Vitelic Inc., Hsin Chu (TW)

( * ) Notice: Subject to any disclaimer, the term of this patent is extended or adjusted under 35 U.S.C. 154(b) by 0 days.

(21) Appl. No.: 09/881,607

(22) Filed: Jun. 13, 2001

(65) Prior Publication Data

US 2003/0001265 A1 Jan. 2, 2003

(51) Int. Cl.⁷ ................ H01L 21/4763; H01L 29/12
(52) U.S. Cl. ............... 438/629; 438/637; 438/667; 438/700; 257/915
(58) Field of Search ............... 257/758, 752, 257/753, 774, 775, 915; 438/118, 222, 622, 690–693, 687, 758, 316, 632–634, 720, 784, 629, 637, 643, 644, 667, 750, 700

(56) References Cited

U.S. PATENT DOCUMENTS

| 4,960,732 | A | * | 10/1990 | Dixit et al. | |
| 5,187,120 | A | | 2/1993 | Wang | 437/192 |
| 5,420,072 | A | * | 5/1995 | Fiordalice et al. | 438/607 |
| 5,552,339 | A | * | 9/1996 | Hsieh | 438/643 |
| 5,641,710 | A | | 6/1997 | Wang et al. | 438/643 |
| 5,654,233 | A | * | 8/1997 | Yu | 438/643 |
| 5,731,225 | A | * | 3/1998 | Yamamori | 438/653 |
| 5,874,355 | A | | 2/1999 | Huang et al. | 438/627 |
| 5,874,356 | A | | 2/1999 | Chen et al. | 438/637 |
| 5,903,053 | A | | 5/1999 | Iijima et al. | 257/751 |
| 5,920,122 | A | | 7/1999 | Matsumoto et al. | 257/764 |
| 6,016,012 | A | | 1/2000 | Chatila et al. | 257/775 |
| 6,093,645 | A | | 7/2000 | Ameen et al. | 438/683 |
| 6,110,789 | A | * | 8/2000 | Rhodes et al. | 438/305 |
| 6,136,691 | A | * | 10/2000 | Chen | 438/627 |
| 6,146,991 | A | * | 11/2000 | Cheng et al. | 438/622 |
| 6,150,257 | A | * | 11/2000 | Yin et al. | 438/622 |
| 6,174,823 | B1 | | 1/2001 | Dobson et al. | 438/778 |
| 6,204,171 | B1 | | 3/2001 | Hu | 438/653 |
| 6,284,657 | B1 | | 9/2001 | Chooi et al. | 438/687 |
| 6,287,988 | B1 | * | 9/2001 | Nagamine et al. | 438/765 |
| 6,319,826 | B1 | * | 11/2001 | Chen et al. | 438/653 |
| 6,333,261 | B1 | * | 12/2001 | Lin et al. | 438/656 |
| 6,475,907 | B1 | * | 11/2002 | Taguwa | 438/648 |

* cited by examiner

*Primary Examiner*—David Nelms
*Assistant Examiner*—Long Tran
(74) *Attorney, Agent, or Firm*—Ronald J. Meetin

(57) ABSTRACT

A tungsten-based interconnect is created by first providing a structure with an opening (464/470) in a structure and then rounding the top edge of the opening. A titanium nitride layer (150) is physically vapor deposited to a thickness less than 30 nm, typically less than 25 nm, over the structure and into the opening. Prior to depositing the titanium nitride layer, a titanium layer (140) may be deposited over the structure and into the opening such that the later-formed titanium nitride layer contacts the titanium layer. In either case, the titanium nitride layer is heated, typically to at least 600° C., while being exposed to nitrogen and/or a nitrogen compound. A tungsten layer (160) is subsequently chemically vapor deposited on the titanium nitride layer and into the opening.

54 Claims, 4 Drawing Sheets

FORMATION OF TUNGSTEIN-BASED INTERCONNECT USING THIN PHYSICALLY VAPOR DEPOSITED TITANIUM NITRIDE LAYER

BACKGROUND

The present invention relates to physical vapor deposition of titanium nitride.

Titanium nitride has been used as a barrier and adhesion layer in fabrication of tungsten plugs in semiconductor integrated circuits. Tungsten plugs interconnect different conductive layers separated by a dielectric. Frequently used dielectrics are silicon dioxide and silicon nitride. Tungsten does not adhere well to silicon dioxide and silicon nitride, so titanium nitride has been used to promote adhesion. In addition, titanium nitride serves as a barrier layer preventing a chemical reaction between $WF_6$ (a compound from which the tungsten is deposited in a chemical vapor deposition process) and other materials present during tungsten deposition. See "Handbook of Semiconductor Manufacturing Technology" (2000), edited by Y. Nichi et al., pages 344–345.

FIGS. 1, 2 illustrate a typical fabrication process. A dielectric layer 110 is deposited over a layer 120 which can be a metal or silicon layer. A via 130 is etched in the dielectric. A thin titanium layer 140 is deposited over dielectric 110 and into the via 130 to improve contact resistance (the titanium dissolves the native oxide on layer 120). Then titanium nitride layer 150 is deposited. Then tungsten 160 is deposited by chemical vapor deposition (CVD) from tungsten hexafluoride ($WF_6$). Tungsten 160 fills the via. Layers 160, 150, 140 are removed from the top surface of dielectric 110 (by chemical mechanical polishing or some other process). See FIG. 2. The via remains filled, so the top surface of the structure is planar. Then a metal layer 210 is deposited. The layers 160, 150, 140 in via 130 provide an electrical contact between the layers 210 and 120.

Titanium nitride 150 can be deposited by a number of techniques, including sputtering and chemical vapor deposition (CVD). Sputtering is less complex and costly (see "Handbook of Semiconductor Manufacturing Technology", cited above, page 411), but the titanium nitride layers deposited by sputtering have a more pronounced columnar grain structure. FIG. 3 illustrates columnar monocrystalline grains 150 G in titanium nitride layer 150. During deposition of tungsten 160, the $WF_6$ molecules can diffuse between the TiN grains and react with titanium 140. This reaction produces titanium fluoride $TiF_3$. $TiF_3$ expands and causes failure of the TiN layer. The cracked TiN leads to a higher exposure of $TiF_3$ to $WF_6$, which in turn leads to the formation of volatile $TiF_4$. $TiF_4$ causes voids in the W film which are known as "volcanoes". To avoid the volcanoes, the sputtered titanium nitride layers have been made as thick as 40 nm, and at any rate no thinner than 30 nm. In addition, the sputtered titanium nitride layers have been annealed in nitrogen atmosphere to increase the size of the TiN grains.

SUMMARY

The inventor has determined that under some conditions thinner annealed layers of sputtered titanium nitride unexpectedly provide better protection against the volcanoes than thicker layers. In some embodiments, fewer volcanoes have been observed with a TiN layer thickness of 20 nm than with 30 nm. In fact, no volcanoes have been observed in some structures formed with the 20 nm TiN layers. Why the thinner TiN layers provide better protection is not clear. Without limiting the invention to any particular theory, it is suggested that perhaps one reason is a lower stress in the thinner annealed layers and a higher density of the TiN grains.

The invention is applicable to physical vapor deposition techniques other than sputtering. Additional features and embodiments of the invention are described below.

DESCRIPTION OF PREFERRED EMBODIMENTS

Figure 4:
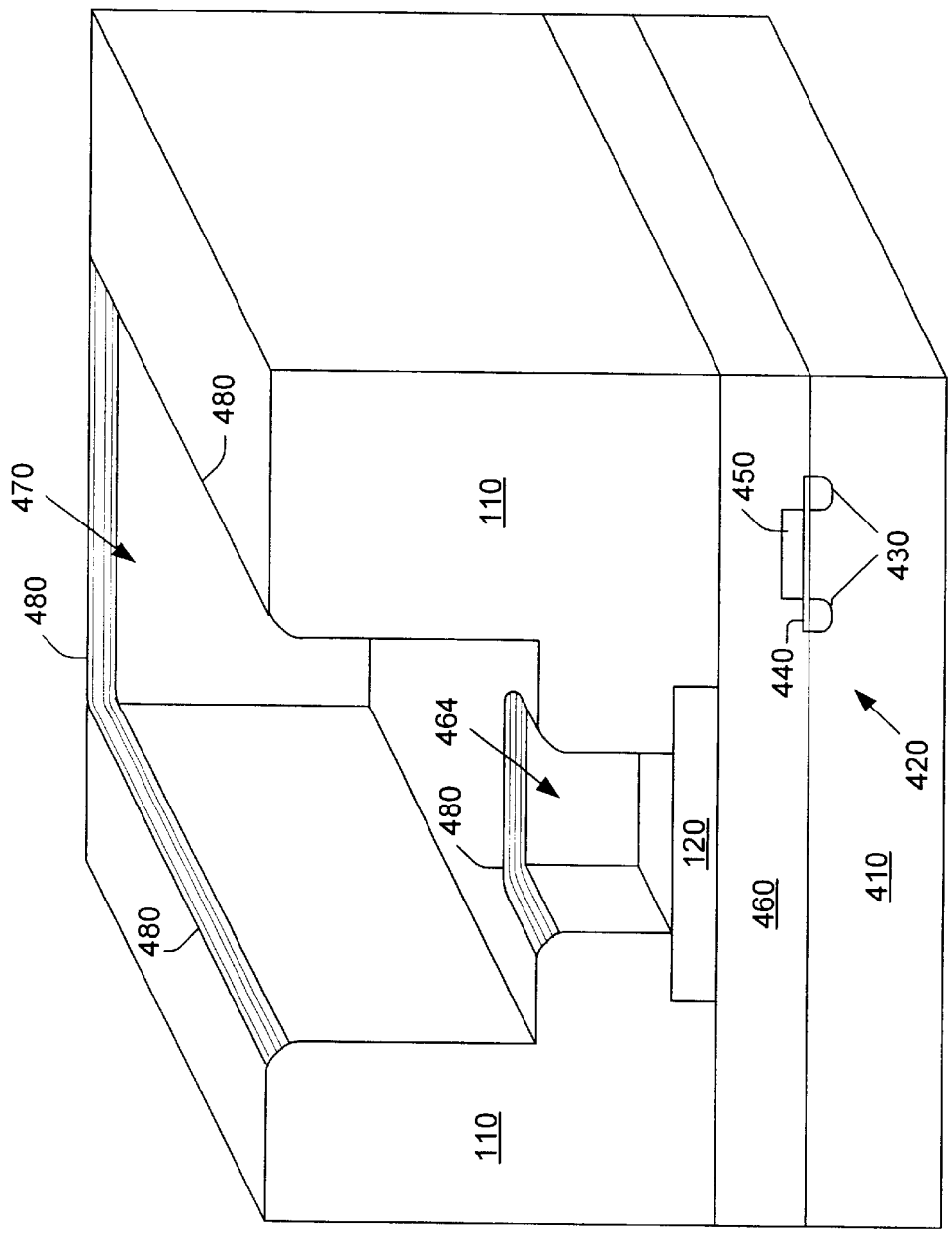
FIGS. 4–6 are cross sectional and perspective views of semiconductor structures in the process of fabrication according to one embodiment of the present invention.

FIG. 4 is a cross sectional and perspective view of a dual damascene semiconductor structure in the process of fabrication according to one embodiment of the present invention. Layer 120 is polysilicon formed by chemical vapor deposition (CVD) over a monocrystalline silicon wafer 410. Before fabrication of layer 120, the wafer 410 may have been processed to form devices such as MOS transistor 420. The transistor's source/drain regions 430 were formed in substrate 410, gate insulation 440 was formed over the substrate, and gate 450 was formed over the gate insulation. Other devices, including non-MOS devices, could be formed using known techniques. Layer 120 can also be part of substrate 410 (this embodiment is not shown in FIG. 4).

In the embodiment of FIG. 4, dielectric 460 was deposited over the wafer. Then layer 120 was formed as described above, and was patterned by a plasma etch. An exemplary thickness of layer 120 is 150 nm.

Dielectric layer 110 was deposited over the layer 120. In some embodiments, dielectric 110 was a combination of two silicon dioxide layers. The first layer was PSG (phosphosilicate glass) deposited by chemical vapor deposition (CVD). The second layer was silicon dioxide deposited by CVD from TEOS. The combined thickness of the two layers was approximately 900 nm.

Then a photoresist layer (not shown) was deposited and patterned photolithographically to define a via 464. In some embodiments, the mask opening defining the via was round in top view, with a diameter of 0.18 $\mu$m. The via was formed in layer 110 with a plasma etch.

The photoresist was removed, and another layer of photoresist (not shown) was deposited and patterned photolithographically to define a trench 470 in dielectric 110 for a tungsten interconnect. The length of the trench 470 was normally at least 2 $\mu$m. In some embodiments, the trench length was approximately 1 mm. The trench width was then 0.22 $\mu$m. The trench was etched with a timed etch to a depth of approximately 250 nm. Via 464 was fully exposed at the bottom of the trench.

Figure 5:
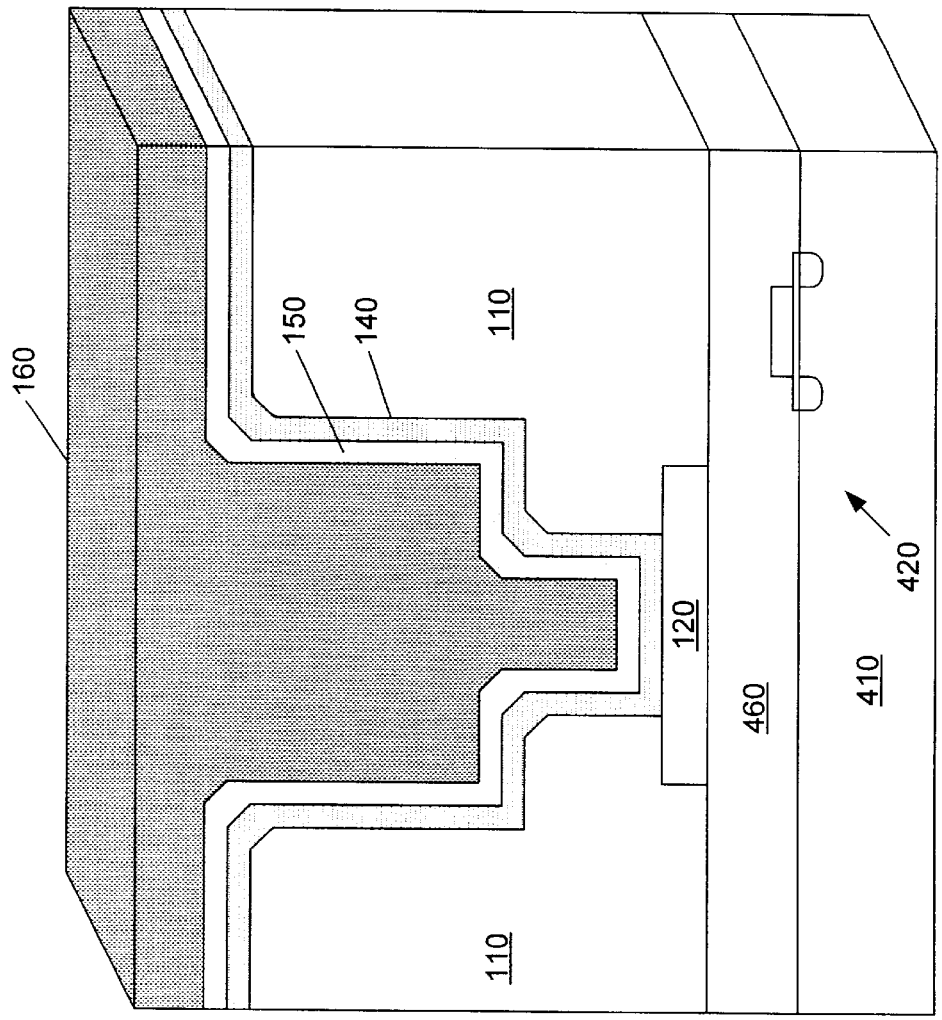

Then the top surface of the structure was exposed to RF plasma in argon atmosphere for 10 seconds. The argon flow was 5 sccm (standard cubic centimeters per minute). The RF power was 315 W. This operation removed native oxide from layer 120. Also, this operation smoothened (rounded) top edges 480 of trench 470 and via 464, i.e., the respective perimetrical top edges formed by the perimeters of trench 470 and via 464 along the surfaces into which they respectively extend. The rounded perimetrical top edges are desirable to reduce stress in titanium nitride 150 (FIG. 5) at these edges so as to reduce the risk of volcano formation. The RF plasma operation was performed in a system of type ENDURA available from Applied Materials of Santa Clara, Calif.

Then titanium layer 140 (FIG. 5) was sputter deposited from a titanium target. The sputtering was performed at a temperature of 200° C. in argon atmosphere. The base pressure (the pressure before the argon flow was turned on) was $5 \times 10^{-7}$ torr. The DC power was 4000 W, the RF power was 2500 W. The wafer AC bias was 150 W. The titanium deposition was performed in a system of type ENDURA, in an ionized metal plasma (IMP) chamber of type Vectra, available from Applied Materials.

The thickness of Ti layer 140 was varied. In one embodiment, the thickness was less than 36 nm, preferably less than 15 nm, more preferably less than 12 nm, typically 10 nm. In another embodiment, the thickness was 36 nm.

Then titanium nitride 150 was deposited by reactive sputtering from a titanium target in a nitrogen atmosphere. The base pressure (the pressure before the nitrogen flow was turned on) was $5 \times 10^{-7}$ torr. The nitrogen flow was 28 sccm (standard cubic centimeters per minute), the DC power was 4000 W, the RF power was 2500 W, the wafer bias was 150 W. The deposition temperature was 200° C. The deposition was performed in a system of type ENDURA, in an IMP chamber of type Vectra, available from Applied Materials.

In one embodiment, the thickness of TiN layer 150 was less than 30 nm, preferably less than 25 nm, more preferably less than 22 nm, typically 20 nm. The thickness of the TiN layer 150 was 30 nm in another embodiment.

Figure 1:
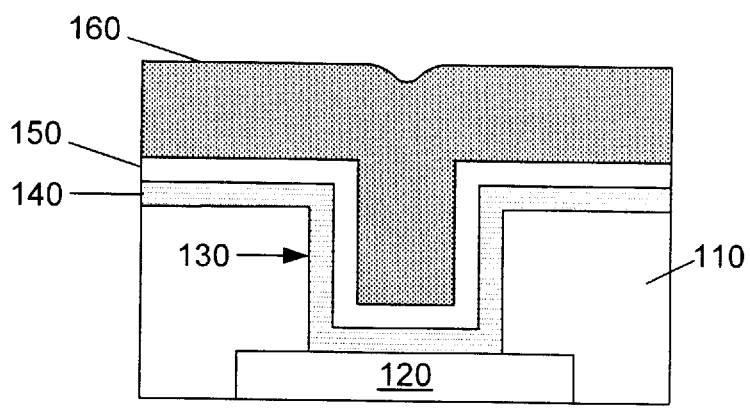
FIGS. 1–3 are cross sectional views of prior art semiconductor structures in the process of fabrication.
Figure 2:
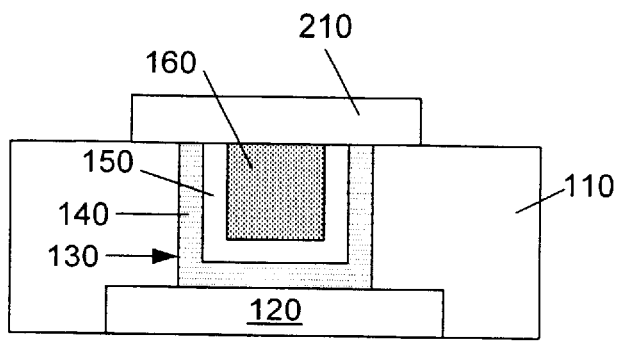
Figure 3:
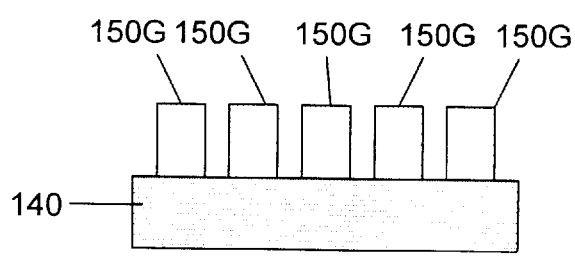

Then the structure was heated to a temperature between 600° C. and 700° C. for 20 to 40 seconds, typically 20 to 30 seconds, in a nitrogen atmosphere. (This operation is referred to herein as Rapid Thermal Anneal, or RTA.) The base pressure was 100–120 torr, the nitrogen flow was 8 slm (standard liters per minute). The temperature was 620° C. in one embodiment, 670° C. in another embodiment. The anneal was performed in a system of type HEATPULSE 8800 available from AG Associates, Inc., of San Jose, Calif. The anneal is believed to have increased the lateral size of TiN grains 150G (FIG. 3).

Then tungsten layer 160 was deposited by CVD in two stages. At the first stage, the chemical reaction was:

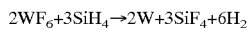

$$2WF_6 + 3SiH_4 \rightarrow 2W + 3SiF_4 + 6H_2$$

This stage lasted 10 seconds. Then the silane (SiH$_4$) flow was turned off, and the hydrogen flow was turned on for the second stage. The chemical reaction was:

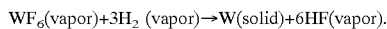

$$WF_6(vapor) + 3H_2(vapor) \rightarrow W(solid) + 6HF(vapor).$$

See S. Wolf, "Silicon Processing for the VLSI Era", vol. 2 (1990), page 246, incorporated herein by reference. Both stages were performed in a system of type CONCEPT 1 available from Novellus Systems of San Jose, Calif. The silane flow was 20 sccm. The hydrogen flow was 12–15 slm (standard liters per minute). The WF$_6$ flow was 350 sccm. The pressure was 40 torr. The temperature was 400° C.

Figure 6:
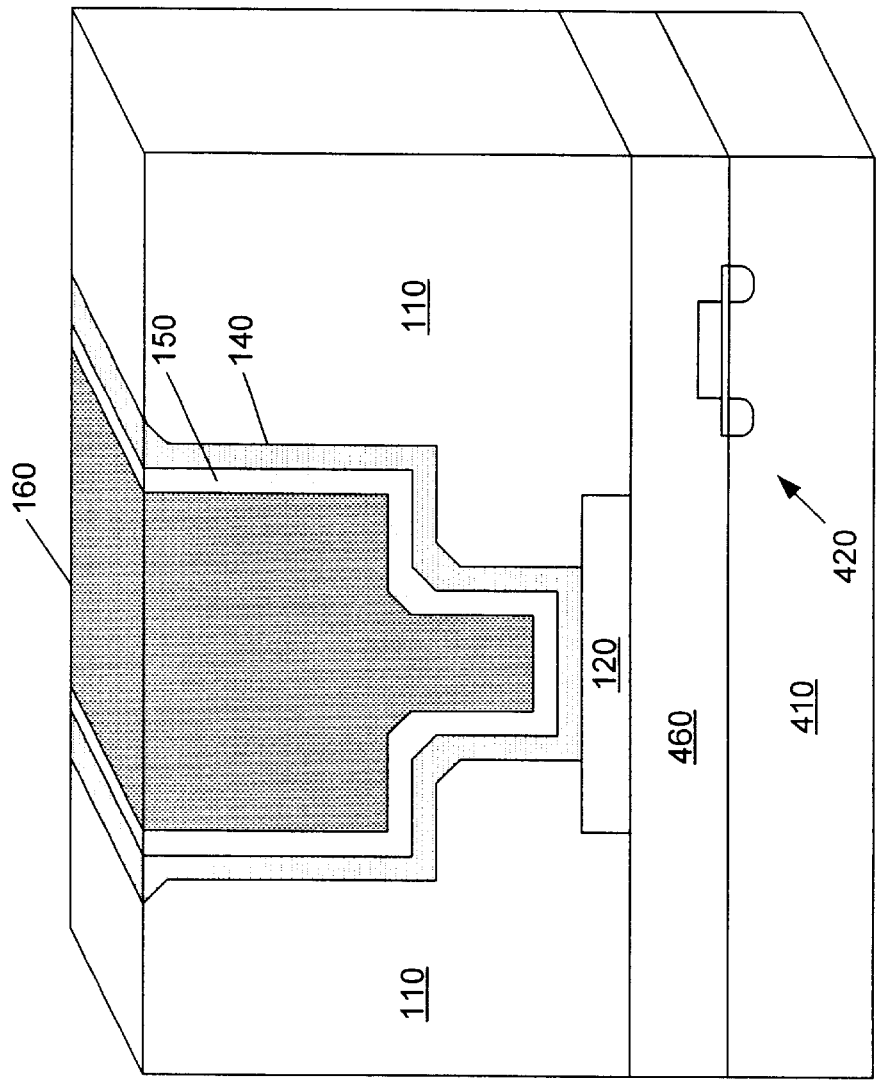

Then the layers 160, 150, 140 were polished off the top of dielectric 110 by CMP. The resulting structure is shown in FIG. 6. Prior to CMP, the structure was examined for volcanoes using an optical microscope and SEM and STEM microscopes. The results are given in Table 1 below. The second column of Table 1 indicates the temperature of the Rapid Thermal Anneal, described above, performed after the deposition of TiN 150 before the deposition of tungsten 160. In Embodiment No. 1, the anneal was omitted.

TABLE 1

| Embodiment No. | RTA of TiN | Ti/TiN thickness: 10 nm/20 nm Volcanoes observed? | Ti/TiN thickness: 36 nm/30 nm Volcanoes observed? |
|---|---|---|---|
| 1. | None | Yes | Yes |
| 2. | 620° C. | No | Yes, but fewer than in Embodiment No. 1 |
| 3. | 670° C. | No | No |

These results show, unexpectedly, that the use of thinner Ti and TiN layers in combination with the RTA can provide a better protection against the volcanoes than thicker layers without the RTA. The thinner layers can eliminate the volcanoes at the lower RTA temperature of 620° C. Lower RTA temperatures are desirable to reduce impurity diffusion during the RTA, to prevent melting or softening of materials having low melting temperatures (e.g. aluminum), and reduce wafer warping. In any event, the sputter deposited TiN layers, such as TiN layer 150, have substantially a columnar grain structure.

The invention is not limited to the particular materials, dimensions, structures, or fabrication processes described above. The invention is not limited to a thickness or composition of any particular layer, or the number, shape and size of vias 464 or trenches 470. The trench length, for example, is 2 μm in some embodiments, and other lengths are possible. The invention is not limited to the particular gas flow rates, temperatures, or any other fabrication parameters or equipment. Some embodiments use nitrogen sources other than pure nitrogen for the RTA or titanium nitride deposition. For example, ammonia (NH$_3$) or H$_2$/N$_2$ can be used. The invention is not limited to the Rapid Thermal Anneal or to any particular anneal temperature. Non-rapid anneals can be used. The anneal can be performed with plasma or with other heating techniques, known or to be invented. The invention is applicable to TiN sputtered from a TiN target. The invention is applicable to single damascene, dual damascene, and other structures, for example, to tungsten plugs formed in contact vias in non-damascene structures, and to tungsten features other than plugs. Titanium 140 is omitted in some embodiments. The invention is applicable to different tungsten CVD techniques, including tungsten deposition from WCl$_6$ rather than WF$_6$. The invention is not limited by particular materials chosen for the layers 120, 110, 460. Some embodiments involve non-silicon semiconductor materials. The invention is not limited to any particular sputtering process, and further is applicable to TiN deposited by physical vapor deposition techniques other than sputtering. For example, pulsed laser deposition and other evaporation techniques can be used. See "Handbook of Semiconductor Manufacturing Technology" (2000), cited above, pages 395–413, incorporated herein by reference. Layer 120 (FIG. 4) can be a metal layer, and can be part of the second, third, or higher metallization layers. The term "layer", as used herein, may refer to a combination of two or more other layers. The invention is defined by the appended claims.

I claim:

1. A fabrication method comprising:
   providing a structure with an opening that extends partway through the structure, the opening having a perimetrical top edge that extends along an exterior surface of the structure;
   rounding the top edge of the opening;

forming a titanium nitride layer over the structure by physical vapor deposition such that the titanium nitride layer extends at least into the opening, the titanium nitride layer being less than 25 nm thick;

heating the titanium nitride layer while exposing the titanium nitride layer to nitrogen and/or a nitrogen compound; and then forming a tungsten layer over and in physical contact with the titanium nitride layer by chemical vapor deposition such that the tungsten layer also extends at least into the opening.

2. The method of claim 1 wherein the titanium nitride layer is formed by sputtering.

3. The method of claim 2 wherein the titanium nitride layer is less than 22 nm thick.

4. The method of claim 2 wherein the titanium nitride layer is about 20 nm thick.

5. The method of claim 1 further comprising, before forming the titanium nitride layer, forming a titanium layer over the structure such that the titanium layer extends at least into the opening in the structure, the titanium nitride layer being subsequently formed so as to be in physical contact with the titanium layer.

6. The method of claim 5 wherein the titanium layer is less than 36 nm thick.

7. The method of claim 5 wherein the titanium layer is about 10 nm thick.

8. The method of claim 1 wherein heating the titanium nitride layer comprises exposing the titanium nitride layer to the nitrogen and/or the nitrogen compound at a temperature of at least 600° C.

9. The method of claim 1 wherein heating the titanium nitride layer comprises exposing the titanium nitride layer to the nitrogen and/or the nitrogen compound at a temperature of about 670° C. for 20–40 seconds.

10. The method of claim 1 wherein heating the titanium nitride layer comprises exposing the titanium nitride layer to the nitrogen and/or the nitrogen compound at a temperature of about 620° C. for 20–40 seconds.

11. The method of claim 1 wherein:

the structure comprises (a) a substrate, (b) a circuit element situated in or over the substrate, and (c) an insulating layer situated over the circuit element and the substrate, the opening in the structure comprising an opening in the insulating layer, the opening in the insulating layer comprising a trench at least 2 µm long;

the titanium nitride layer and the tungsten layer extend into the opening in the insulating layer; and the tungsten layer electrically contacts the circuit element through material of the titanium nitride layer in the opening in the insulating layer.

12. The method of claim 11 wherein the substrate is a semiconductor substrate.

13. The method of claim 12 wherein the trench is at least 1 mm long.

14. The method of claim 13 further comprising, before forming the titanium nitride layer, depositing a titanium layer over the insulating layer such that the titanium layer extends at least into an opening in the insulating layer and such that the tungsten layer electrically contacts the circuit element through material of the titanium and titanium nitride layers in the opening in the insulating layer.

15. The method of claim 14 wherein the trench does not penetrate the insulating layer but a via at the bottom of the trench penetrates the insulating layer and exposes the circuit element, wherein the titanium layer physically contacts the circuit element at the bottom of the via.

16. The method of claim 13 wherein the circuit element is conductive.

17. The method of claim 13 wherein the circuit element comprises metal or semiconductor material.

18. The method of claim 13 wherein the opening in the structure includes a via at the bottom of the trench, the method further comprising rounding the via along its perimetrical top edge.

19. A structure formed by the method of claim 1.

20. The structure of claim 19 wherein the titanium nitride layer has a substantially columnar grain structure.

21. A structure formed by the method of claim 2.

22. The structure of claim 21 wherein the titanium nitride layer has a substantially columnar grain structure.

23. The method of claim 1 where the chemical vapor deposition of the tungsten layer comprises reacting a tungsten halide with silane and subsequently with hydrogen.

24. The method of claim 23 wherein the tungsten halide comprises tungsten hexafluoride.

25. A method for fabricating an integrated circuit, the method comprising:

forming a circuit element in or over a semiconductor substrate;

forming an insulating layer over the circuit element;

forming an opening through the insulating layer to expose the circuit element at the bottom of the opening, the opening having a perimetrical top edge that extends along an exterior surface of the insulating layer;

rounding the top edge of the opening;

forming a titanium layer over the insulating layer, the titanium layer overlaying side and bottom surfaces of the opening, the titanium layer being less than 15 nm thick;

forming a titanium nitride layer over the titanium layer, the titanium nitride layer being less than 25 nm thick, the titanium nitride layer being formed by sputtering;

heating the titanium nitride layer while exposing the titanium nitride layer to nitrogen and/or a nitrogen compound; and forming a tungsten layer by chemical vapor deposition over the titanium nitride layer, the tungsten layer at least partially filling the opening and electrically contacting the circuit element through the titanium and titanium nitride layers.

26. The method of claim 25 wherein the opening comprises a trench at least 2 µm long.

27. The method of claim 25 wherein the opening comprises a trench at least 1 mm long.

28. The method of claim 25 wherein heating the titanium nitride layer comprises heating the titanium nitride layer at a temperature of about 670° C. for 20–40 seconds.

29. The method of claim 25 wherein heating the titanium nitride layer comprises heating the titanium nitride layer at a temperature of about 620° C. for 20–40 seconds.

30. The method of claim 25 wherein heating the titanium nitride layer comprises exposing the titanium nitride layer to the nitrogen and/or the nitrogen compound at a temperature of at least 600° C.

31. A fabrication method comprising:

providing a structure with an opening that extends partway through the structure, the opening having a perimetrical top edge that extends along an exterior surface of the structure;

rounding the top edge of the opening;

forming a titanium nitride layer over the structure by physical vapor deposition such that the titanium nitride layer extends at least into the opening, the titanium nitride layer being less than 30 nm thick;

heating the titanium nitride layer to a temperature above 600° C. while exposing the titanium nitride layer to nitrogen and/or a nitrogen compound; and then forming a tungsten layer over and in physical contact with the titanium nitride layer by chemical vapor deposition such that the tungsten layer also extends at least into the opening.

32. The method of claim 31 wherein the titanium nitride layer is formed by sputtering.

33. The method of claim 31 further comprising, before forming the titanium nitride layer, forming a titanium layer over the structure such that the titanium layer extends at least into the opening in the structure, the titanium nitride layer being subsequently formed so as to be in physical contact with the titanium layer.

34. The method of claim 33 wherein the titanium layer is less than 36 nm thick.

35. The method of claim 31 wherein heating the titanium nitride layer comprises exposing the titanium nitride layer to the nitrogen and/or the nitrogen compound at a temperature of about 670° C. for 20–40 seconds.

36. The method of claim 31 wherein heating the titanium nitride layer comprises exposing the titanium nitride layer to the nitrogen and/or the nitrogen compound at a temperature of about 620° C. for 20–40 seconds.

37. The method of claim 31 wherein:

the structure comprises (a) a substrate, (b) a circuit element situated in or over the substrate, and (c) an insulating layer situated over the circuit element and the substrate, the opening in the structure comprising an opening in the insulating layer, the opening in the insulating layer comprising a trench at least 2 $\mu$m long;

the titanium nitride layer and the tungsten layer extend into the opening in the insulating layer; and the tungsten layer electrically contacts the circuit element through material of the titanium nitride layer in the opening in the insulating layer.

38. The method of claim 37 wherein the substrate is a semiconductor substrate.

39. The method of claim 38 wherein the trench is at least 1 mm long.

40. The method of claim 39 further comprising, before forming the titanium nitride layer, depositing a titanium layer over the insulating layer such that the titanium layer extends at least into an opening in the insulating layer and such that the tungsten layer electrically contacts the circuit element through material of the titanium and titanium nitride layers in the opening in the insulating layer.

41. The method of claim 40 wherein the trench does not penetrate the insulating layer but a via at the bottom of the trench penetrates the insulating layer and exposes the circuit element, wherein the titanium layer physically contacts the circuit element at the bottom of the via.

42. The method of claim 39 wherein the opening in the structure includes a via at the bottom of the trench, the method further comprising rounding the via along its perimetrical top edge.

43. A structure formed by the method of claim 31.

44. The structure of claim 43 wherein the titanium nitride layer has a substantially columnar grain structure.

45. The method of claim 31 where the chemical vapor deposition of the tungsten layer comprises reacting a tungsten halide with silane and subsequently with hydrogen.

46. The method of claim 45 wherein the tungsten halide comprises tungsten hexafluoride.

47. A fabrication method comprising:

providing a structure with an opening that extends partway through the structure, the opening having a perimetrical top edge that extends along an exterior surface of the structure;

rounding the top edge of the opening;

forming a titanium nitride layer over the structure by physical vapor deposition such that the titanium nitride layer extends at least into the opening, the titanium nitride layer being less than 30 nm thick;

heating the titanium nitride layer while exposing the titanium nitride layer to nitrogen and/or a nitrogen compound; and then forming a tungsten layer over and in physical contact with the titanium nitride layer by chemical vapor deposition such that the tungsten layer also extends at least into the opening.

48. The method of claim 47 wherein the titanium nitride layer is formed by sputtering.

49. The method of claim 47 further comprising, before forming the titanium nitride layer, forming a titanium layer over the structure such that the titanium layer extends at least into the opening in the structure, the titanium nitride layer being subsequently formed so as to be in physical contact with the titanium layer.

50. The method of claim 47 wherein the chemical vapor deposition of the tungsten layer comprises reacting a tungsten halide with silane and subsequently with hydrogen.

51. The method of claim 50 wherein the tungsten halide comprises tungsten hexafluoride.

52. A fabrication method comprising:

forming a titanium nitride layer over a structure by physical vapor deposition such that the titanium nitride layer extends at least into an opening in the structure, the titanium nitride layer being less than 30 nm thick;

heating the titanium nitride layer while exposing the titanium nitride layer to nitrogen and/or a nitrogen compound; and then forming a tungsten layer over and in physical contact with the titanium nitride layer by chemical vapor deposition such that the tungsten layer also extends at least into the opening, the chemical vapor deposition of the tungsten layer comprising reacting a tungsten halide with silane and subsequently with hydrogen.

53. The method of claim 52 wherein the tungsten halide comprises tungsten hexafluoride.

54. The method of claim 52 wherein the titanium nitride layer is formed by sputtering.

* * * * *